United States Patent
Si et al.

(10) Patent No.: US 10,381,071 B1
(45) Date of Patent: Aug. 13, 2019

(54) MULTI-BIT COMPUTING CIRCUIT FOR COMPUTING-IN-MEMORY APPLICATIONS AND COMPUTING METHOD THEREOF

(71) Applicant: NATIONAL TSING HUA UNIVERSITY, Hsinchu (TW)

(72) Inventors: Xin Si, Hsinchu (TW); Meng-Fan Chang, Taichung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 16/049,799

(22) Filed: Jul. 30, 2018

(51) Int. Cl.
| | |
|---|---|
| G11C 11/00 | (2006.01) |
| G11C 11/419 | (2006.01) |
| G11C 11/412 | (2006.01) |
| G11C 11/56 | (2006.01) |
| G11C 11/418 | (2006.01) |

(52) U.S. Cl.
CPC .......... *G11C 11/419* (2013.01); *G11C 11/412* (2013.01); *G11C 11/418* (2013.01); *G11C 11/56* (2013.01)

(58) Field of Classification Search
CPC ..... G11C 7/1075; G11C 7/1078; G11C 11/24; G11C 11/4093; G11C 7/1051
See application file for complete search history.

(56) References Cited

U.S. PATENT DOCUMENTS

| | | | | |
|---|---|---|---|---|
| 6,175,514 B1* | 1/2001 | Henderson | ........... | G11C 7/1075 365/154 |
| 6,754,094 B2* | 6/2004 | McClure | ................ | G11C 29/50 365/145 |
| 2012/0230130 A1* | 9/2012 | Sheppard | ................ | G11C 8/14 365/189.011 |
| 2013/0107651 A1* | 5/2013 | Singh | .................... | G11C 11/412 365/207 |
| 2018/0144240 A1* | 5/2018 | Garbin | ................ | G11C 11/1659 |

* cited by examiner

*Primary Examiner* — Tuan T Nguyen
(74) *Attorney, Agent, or Firm* — CKC & Partners Co., LLC (57) ABSTRACT

A multi-bit computing circuit for computing-in-memory applications is controlled by an input port and includes a memory cell array and a capacitor sharing unit. The memory cell array includes a plurality of memory cells connected to the input port. The memory cells store a weight which is formed in two's complement. The capacitor sharing unit includes a plurality of switches, a plurality of capacitors and a sense amplifier. The switches are electrically connected to the memory cells, respectively. The capacitors are electrically connected to the switches, respectively. The sense amplifier is electrically connected to the capacitors and generates a total operational value. The capacitors are located among the switches and the sense amplifier, and the switches are switched to enable the total operational value to be equal to the input value multiplied by the weight. The present disclosure utilizes 8T SRAM cells without an extra DAC structure.

20 Claims, 8 Drawing Sheets

MULTI-BIT COMPUTING CIRCUIT FOR COMPUTING-IN-MEMORY APPLICATIONS AND COMPUTING METHOD THEREOF

BACKGROUND

Technical Field

The present disclosure relates to a multi-bit computing circuit for computing-in-memory applications and a computing method thereof. More particularly, the present disclosure relates to a multi-bit computing circuit for computing-in-memory applications and a computing method thereof which are capable of solving the problem of the write disturb without an extra digital-to-analog convertor.

Description of Related Art

In these years, due to the industrial growth of mobile device, medical electrical equipment, portable storage, etc., requirement of memory with low power, high speed and high density is increased. In one conventional computing-in-memory structure, it often has to turn on a large number of word lines to realize the multiply and accumulate (MAC) operation with multi-bit inputs and weights. An extra digital-to-analog convertor (DAC) is required to support multi-bit MAC operation, which results in larger area overhead. In a static random access memory (SRAM) cell, no matter a stored value is 0 or 1, a direction of a current is the same. Therefore, it is impossible to realize both negative and positive weights in the same BL. Moreover, in a conventional 6T SRAM, there exists a write disturb issue when a large number of WLs are activated. Accordingly, a multi-bit computing circuit for computing-in-memory applications and a computing method thereof having the features of solving the problem of the write disturb and no need for an extra digital-to-analog convertor are commercially desirable.

SUMMARY

According to one aspect of the present disclosure, a multi-bit computing circuit for computing-in-memory applications is controlled by a first bit line, a second bit line, a word line and an input port. The input port transmits an input value, and the multi-bit computing circuit for the computing-in-memory applications includes a memory cell array and a capacitor sharing unit. The memory cell array includes a plurality of memory cells connected to the first bit line, the second bit line, the word line and the input port. The memory cells store a weight which is formed in two's complement. Each of the memory cells generates a cell output signal according to the input value and the weight. The capacitor sharing unit is electrically connected to the memory cell array, and the capacitor sharing unit includes a plurality of switches, a plurality of capacitors and a sense amplifier. The switches are electrically connected to the cell output signals, respectively. The capacitors are electrically connected to the switches, respectively. The sense amplifier is electrically connected to the capacitors and generates a total operational value. The capacitors are located among the switches and the sense amplifier, and the switches are switched to enable the total operational value to be equal to the input value multiplied by the weight.

According to another aspect of the present disclosure, a multi-bit computing circuit for computing-in-memory applications is controlled by a first bit line, a second bit line, a word line and a plurality of input ports. Each of the input ports transmits an input value, and the multi-bit computing circuit for the computing-in-memory applications includes a memory cell array and a capacitor sharing unit. The memory cell array includes a plurality of memory cells arranged in a matrix and connected to the first bit line, the second bit line, the word line and the input ports. The memory cells store a plurality of weights which are formed in two's complement. Each of the memory cells generates a cell output signal according to one of the input values and one of the weights. The capacitor sharing unit is electrically connected to the memory cell array, and the capacitor sharing unit includes a plurality of switches, a plurality of capacitors and a sense amplifier. The switches are electrically connected to the cell output signals, respectively. The capacitors are electrically connected to the switches, respectively. The sense amplifier is electrically connected to the capacitors and generates a total operational value. The capacitors are located among the switches and the sense amplifier. The switches are switched to generate a plurality of multiply results by the input values respectively multiplied by the weights, and then the total operational value is equal to a sum of the multiply results.

According to further another aspect of the present disclosure, a computing method of the multi-bit computing circuit for the computing-in-memory applications provides a voltage level applying step, a first computing step and a second computing step. The voltage level applying step is for applying a plurality of voltage levels to the input value, the weight and the switches, respectively. The first computing step is for driving the memory cells of the memory cell array to generate the cell output signal according to the voltage levels of the input value and the weight. The second computing step is for driving the capacitor sharing unit and switching the switches to enable the total operational value to be equal to the input value multiplied by the weight.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
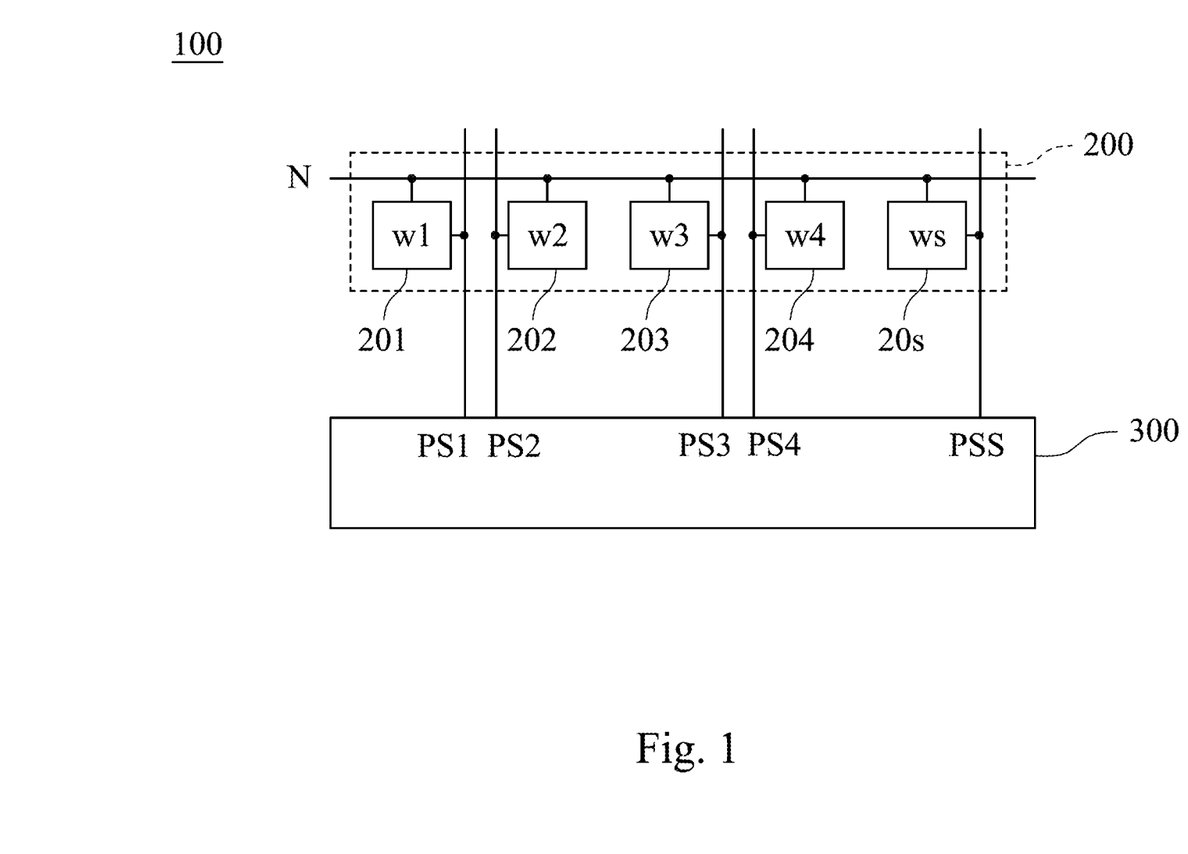
FIG. 1 shows a block diagram of a multi-bit computing circuit for computing-in-memory applications according to one embodiment of the present disclosure.
Figure 2:
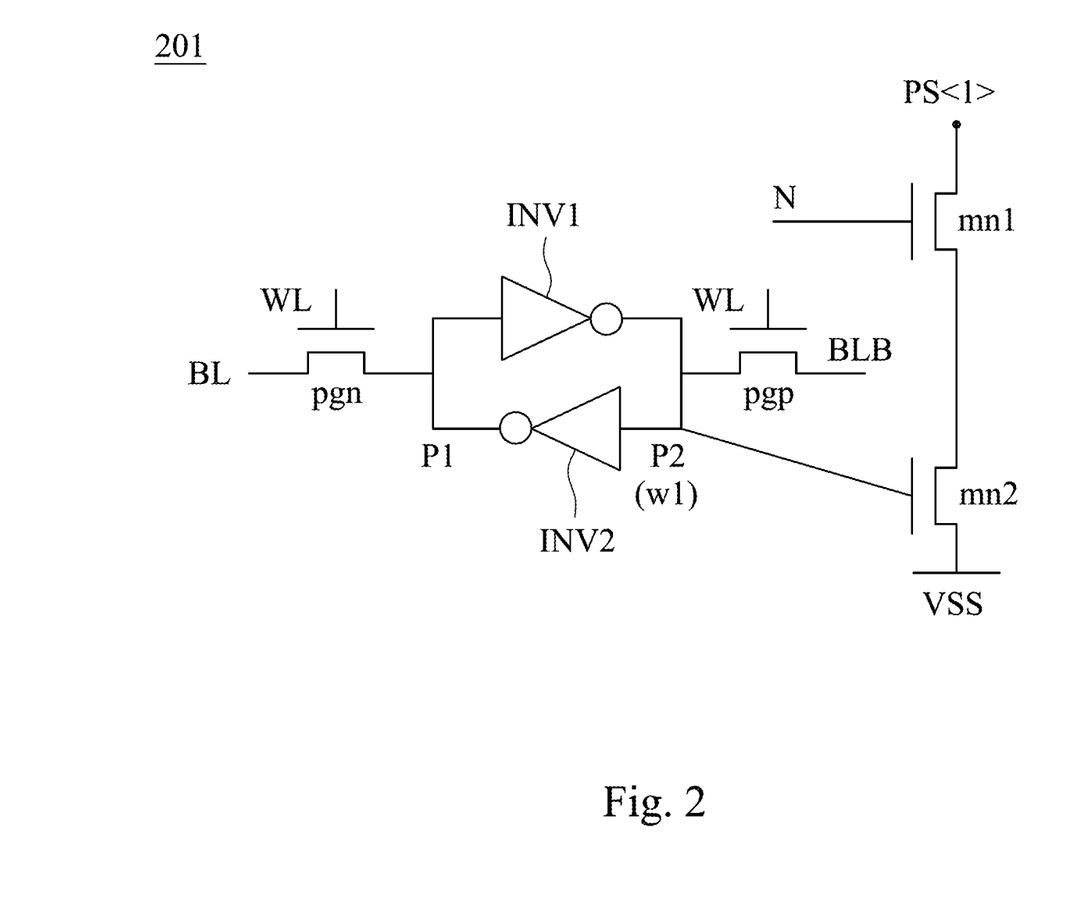
FIG. 2 shows a circuit diagram of a memory cell of the multi-bit computing circuit for the computing-in-memory applications of FIG. 1.
Figure 3:
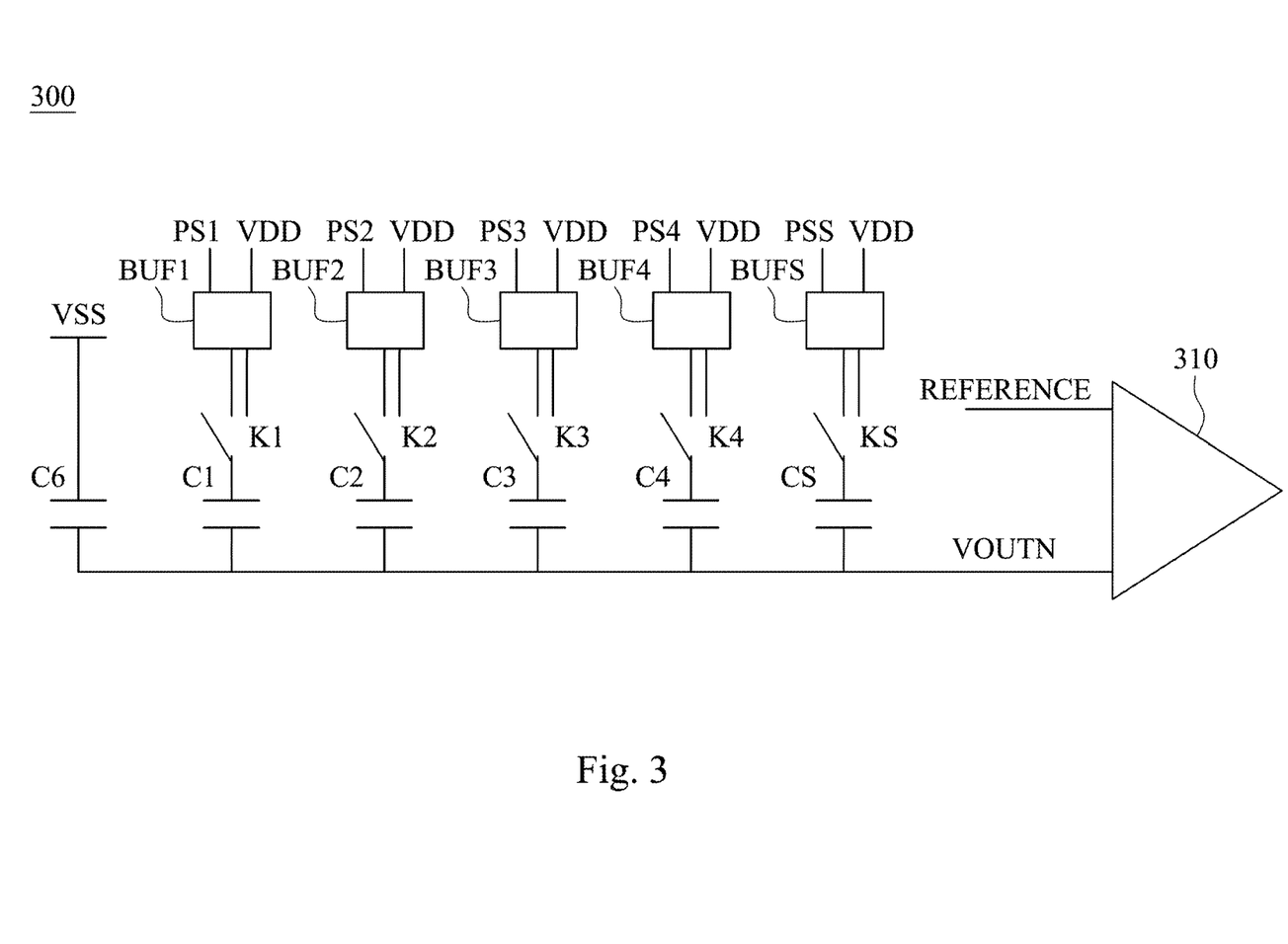
FIG. 3 shows a circuit diagram of a capacitor sharing unit of the multi-bit computing circuit for the computing-in-memory applications of FIG. 1.
Figure 4:
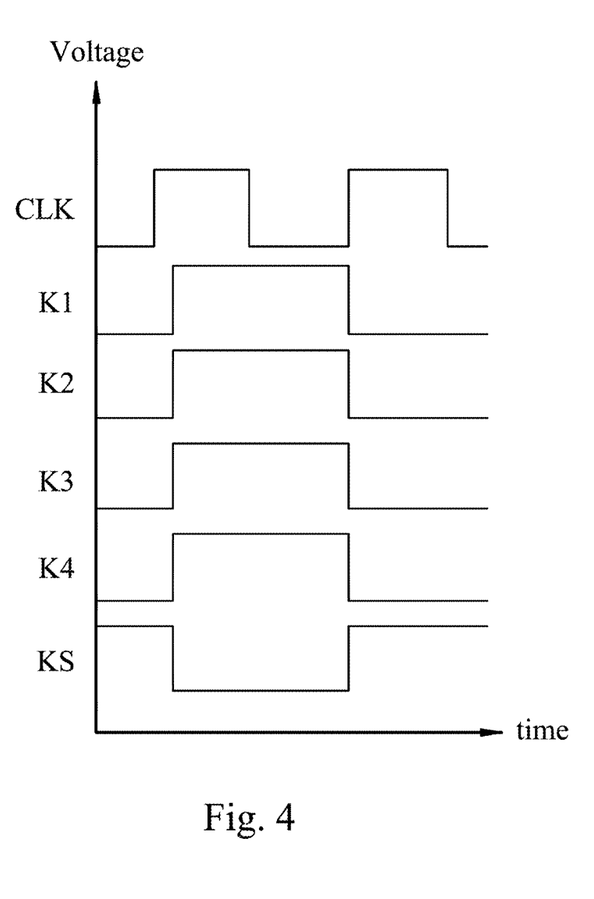
FIG. 4 shows timing diagrams of voltages of the switches of the capacitor sharing unit of FIG. 3.

FIG. 1 shows a block diagram of a multi-bit computing circuit 100 for computing-in-memory applications according to one embodiment of the present disclosure; FIG. 2 shows a circuit diagram of a memory cell 201 of the multi-bit computing circuit 100 for the computing-in-memory applications of FIG. 1; FIG. 3 shows a circuit diagram of a capacitor sharing unit 300 of the multi-bit computing circuit 100 for the computing-in-memory applications of FIG. 1; and FIG. 4 shows timing diagrams of voltages of the switches K1, K2, K3, K4, KS of the capacitor sharing unit 300 of FIG. 3. The multi-bit computing circuit 100 for the computing-in-memory applications is controlled by a first bit line BL, a second bit line BLB, a word line WL and an input port N. The input port N transmits an input value which is a multi-bit input value. The multi-bit input value is given sequentially via the input port N. The multi-bit computing circuit 100 for the computing-in-memory applications includes a memory cell array 200 and a capacitor sharing unit 300.

The memory cell array 200 includes a plurality of memory cells connected to the first bit line BL, the second bit line BLB, the word line WL and the input port N. The memory cells store a weight which is formed in two's complement. Each of the memory cells generates a cell output signal PS<1> according to the input value of the input port N and the weight. In detail, the memory cells include a first memory cell 201, a second memory cell 202, a third memory cell 203, a fourth memory cell 204 and a fifth memory cell 20s. The first memory cell 201 stores a first bit value w1 of the weight and generates a first cell output signal PS1 which is transmitted to the capacitor sharing unit 300. The second memory cell 202 stores a second bit value w2 of the weight and generates a second cell output signal PS2 which is transmitted to the capacitor sharing unit 300. The third memory cell 203 stores a third bit value w3 of the weight and generates a third cell output signal PS3 which is transmitted to the capacitor sharing unit. The fourth memory cell 204 stores a fourth bit value w4 of the weight and generates a fourth cell output signal PS4 which is transmitted to the capacitor sharing unit. The fifth memory cell 20s stores a fifth bit value ws of the weight and generates a fifth cell output signal PSS which is transmitted to the capacitor sharing unit. The first memory cell 201 has a first node P1 and a second node P2. The second node P2 transmits the weight. The first memory cell 201 includes a first inverter INV1, a second inverter INV2, a first transistor pgn, a second transistor pgp, a third transistor mn2 and a fourth transistor mn1. The first inverter INV1 is located between the first node P1 and the second node P2. An input of the first inverter INV1 is connected to the first node P1, and an output of the first inverter INV1 is connected to the second node P2. The second inverter INV2 is connected to the first inverter INV1. The first transistor pgn is connected to the first node P1, the first bit line BL and the word line WL. The second transistor pgp is connected to the second node P2, the second bit line BLB and the word line WL. The third transistor mn2 is connected to the second node P2 and a ground voltage VSS. The fourth transistor mn1 is connected to the third transistor mn2, the input port N and the capacitor sharing unit 300. The fourth transistor mn1 generates one of the cell output signals PS<1> (i.e., the first cell output signal PS1 of the first memory cell 201) according to the input value of the input port N. The structure of the first memory cell 201 is the same as each structure of the second memory cell 202, the third memory cell 203, the fourth memory cell 204 and the fifth memory cell 20s. Each of the first memory cell 201, the second memory cell 202, the third memory cell 203, the fourth memory cell 204 and the fifth memory cell 20s is an 8T SRAM cell. A first bit value w1 of the weight is equal to a voltage level of the second node P2 of the first memory cell 201. A second bit value w2 of the weight is equal to a voltage level of the second node P2 of the second memory cell 202. A third bit value w3 of the weight is equal to a voltage level of the second node P2 of the third memory cell 203. A fourth bit value w4 of the weight is equal to a voltage level of the second node P2 of the fourth memory cell 204. A fifth bit value ws of the weight is equal to a voltage level of the second node P2 of the fifth memory cell 20s.

The capacitor sharing unit 300 is electrically connected to the memory cell array 200, and the capacitor sharing unit 300 includes a plurality of switches, a plurality of capacitors, a plurality of buffers and a sense amplifier 310. The switches are electrically connected to the cell output signals PS<1>, respectively. The capacitors are electrically connected to the switches, respectively. The sense amplifier 310 is electrically connected to the capacitors and generates a total operational value. The capacitors are located among the switches and the sense amplifier 310, and the switches are switched to enable the total operational value to be equal to the input value multiplied by the weight. In detail, the capacitor sharing unit 300 further includes a capacitor output node VOUTN connected among the sense amplifier 310 and the capacitors. The capacitors include a first capacitor C1, a second capacitor C2, a third capacitor C3, a fourth capacitor C4, a fifth capacitor CS and a sixth capacitor C6. The first capacitor C1 is connected between the capacitor output node VOUTN and the first memory cell 201. The first capacitor C1 has a first capacitance. The second capacitor C2 is connected between the capacitor output node VOUTN and the second memory cell 202. The second capacitor C2 has a second capacitance which is equal to twice the first capacitance. The third capacitor C3 is connected between the capacitor output node VOUTN and the third memory cell 203. The third capacitor C3 has a third capacitance which is equal to four times the first capacitance. The fourth capacitor C4 is connected between the capacitor output node VOUTN and the fourth memory cell 204. The fourth capacitor C4 has a fourth capacitance which is equal to eight times the first capacitance. The fifth capacitor CS is connected between the capacitor output node VOUTN and the fifth memory cell 20s. The fifth capacitor has a fifth capacitance which is equal to sixteen times the first capacitance. The sixth capacitor C6 is connected between the capacitor output node VOUTN and the ground voltage VSS. The sixth capacitor C6 has a sixth capacitance which is equal to the first capacitance.

In addition, the switches include a first switch K1, a second switch K2, a third switch K3, a fourth switch K4 and a fifth switch KS, as shown in FIG. 3. The first switch K1 is connected between the first capacitor C1 and the first memory cell 201. The first switch K1 is switched to enable the first capacitor C1 to be coupled to a power source voltage VDD or the first cell output signal PS1. The second switch K2 is connected between the second capacitor C2 and the second memory cell 202. The second switch K2 is switched to enable the second capacitor C2 to be coupled to the power source voltage VDD or the second cell output signal PS2. The third switch K3 is connected between the third capacitor C3 and the third memory cell 203. The third switch K3 is switched to enable the third capacitor C3 to be coupled to the power source voltage VDD or the third cell output signal PS3. The fourth switch K4 connected between the fourth capacitor C4 and the fourth memory cell 204. The fourth switch K4 is switched to enable the fourth capacitor C4 to be coupled to the power source voltage VDD or the fourth cell output signal PS4. The fifth switch KS is connected between the fifth capacitor CS and the fifth memory cell 20s. The fifth switch KS is switched to enable the fifth capacitor CS to be coupled to the power source voltage VDD or the fifth cell output signal PSS. The first switch K1, the second switch K2, the third switch K3, the fourth switch K4 and the fifth switch KS are synchronously switched according to a clock signal CLK, as shown in FIG. 4. When voltage levels of the first switch K1, the second switch K2, the third switch K3 and the fourth switch K4 are equal to one, a voltage level of the fifth switch KS is equal to zero. The first capacitor C1 is coupled to the first cell output signal PS1 via the first switch K1. The second capacitor C2 is coupled to the second cell output signal PS2 via the second switch K2. The third capacitor C3 is coupled to the third cell output signal PS3 via the third switch K3. The fourth capacitor C4 is coupled to the fourth cell output signal PS4 via the fourth switch K4. The fifth capacitor CS is coupled to the power source voltage VDD via the fifth switch KS. On the contrary, when the voltage levels of the first switch K1, the second switch K2, the third switch K3 and the fourth switch K4 are equal to zero, the voltage level of the fifth switch KS is equal to one. The first capacitor C1 is coupled to the power source voltage VDD via the first switch K1. The second capacitor C2 is coupled to the power source voltage VDD via the second switch K2. The third capacitor C3 is coupled to the power source voltage VDD via the third switch K3. The fourth capacitor C4 is coupled to the power source voltage VDD via the fourth switch K4. The fifth capacitor CS is coupled to the fifth cell output signal PSS via the fifth switch KS.

Furthermore, the buffers are connected among the switches and the memory cell array 200, as shown in FIG. 3. The buffers include a first buffer BUF1, a second buffer BUF2, a third buffer BUF3, a fourth buffer BUF4 and a fifth buffer BUFS. The first buffer BUF1 is connected between the first switch K1 and the first memory cell 201. The first buffer BUF1 is configured to store the power source voltage VDD or the first cell output signal PS1. The second buffer BUF2 is connected between the second switch K2 and the second memory cell 202. The second buffer BUF2 is configured to store the power source voltage VDD or the second cell output signal PS2. The third buffer BUF3 is connected between the third switch K3 and the third memory cell 203. The third buffer BUF3 is configured to store the power source voltage VDD or the third cell output signal PS3. The fourth buffer BUF4 is connected between the fourth switch K4 and the fourth memory cell 204. The fourth buffer BUF4 is configured to store the power source voltage VDD or the fourth cell output signal PS4. The fifth buffer BUFS is connected between the fifth switch KS and the fifth memory cell 20s. The fifth buffer BUFS is configured to store the power source voltage VDD or the fifth cell output signal PSS. The sense amplifier 310 senses a voltage level of the capacitor output node VOUTN and a reference signal REFERENCE. Then, the sense amplifier 310 generates the total operational value. Therefore, the multi-bit computing circuit 100 for the computing-in-memory applications of the present disclosure utilizes a signed multi-bit weight stored in the memory cell array 200 in two's complement representation and the capacitor sharing unit 300 sharing for the total summation. Moreover, the input value of the input port N is given from a gate of the fourth transistor mn1 and the 8T SRAM cells, so that the multi-bit computing circuit 100 can solve the problem of the write disturb and be suitable for the computing-in-memory applications.

Figure 5:
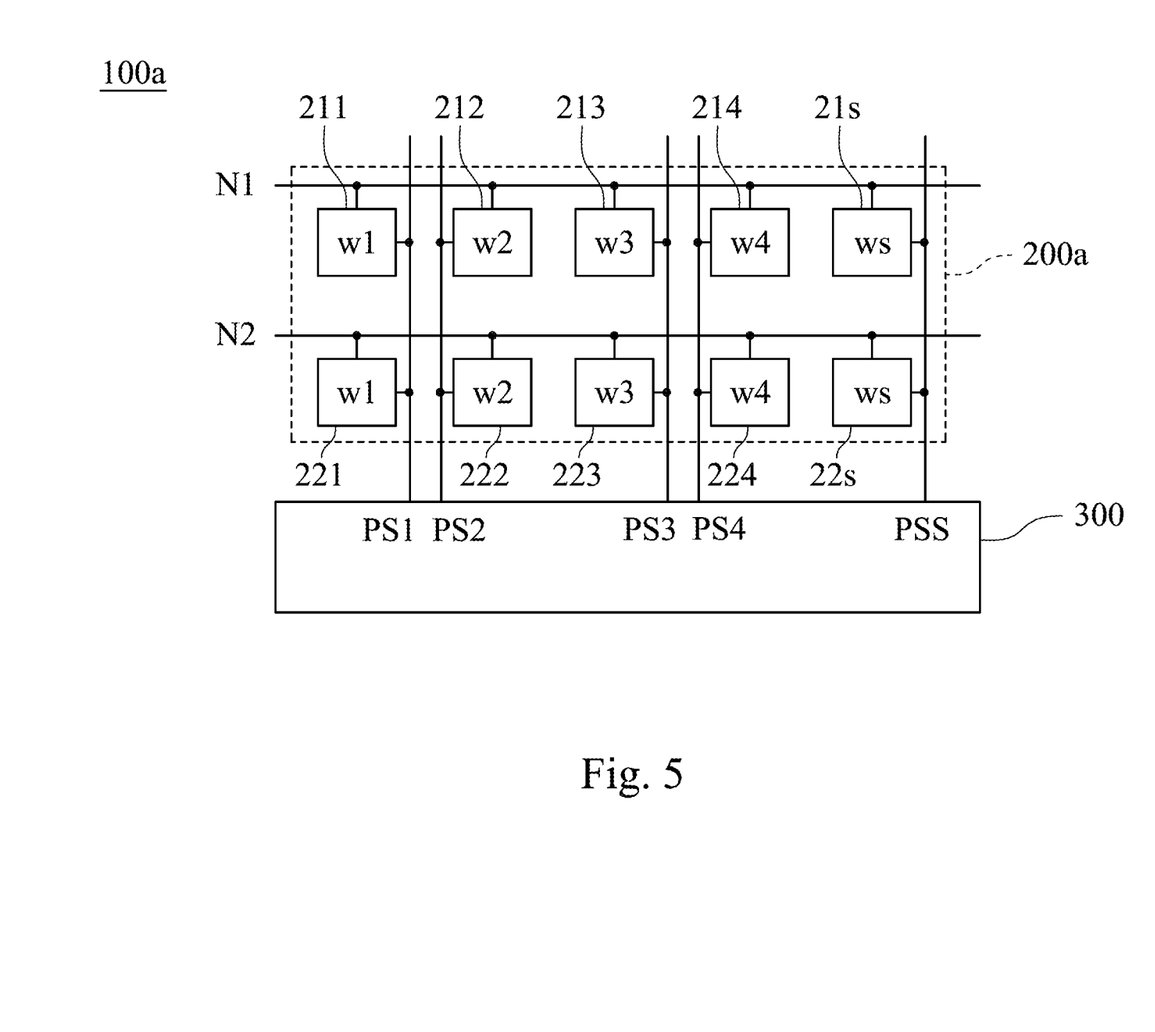
FIG. 5 shows a block diagram of a multi-bit computing circuit for computing-in-memory applications according to another embodiment of the present disclosure.

FIG. 5 shows a block diagram of a multi-bit computing circuit 100a for computing-in-memory applications according to another embodiment of the present disclosure. The multi-bit computing circuit 100a for the computing-in-memory applications is controlled by a first bit line BL, a second bit line BLB, a word line WL and two input ports N1, N2. The two input ports N1, N2 transmit two input values, respectively, and the multi-bit computing circuit 100a for the computing-in-memory applications includes a memory cell array 200a and a capacitor sharing unit 300.

In FIG. 5, the detail of the capacitor sharing unit 300 is the same as the embodiments of FIG. 1, and will not be described again herein. In FIG. 5, the multi-bit computing circuit 100a for the computing-in-memory applications further includes the memory cell array 200a. The memory cell array 200a includes a plurality of memory cells arranged in a matrix and is connected to the first bit line BL, the second bit line BLB, the word line WL and the two input ports N1, N2. The memory cells store two weights which are formed in two's complement, and each of the memory cells generates a cell output signal PS<1> according to one of the two input values and one of the two weights. The structure of each of the memory cells of FIG. 5 is the same as the structure of the first memory cell 201 of FIG. 2. The memory cells include two first memory cells 211, 221, two second memory cells 212, 222, two third memory cells 213, 223, two fourth memory cells 214, 224 and two fifth memory cells 21s, 22s. The first memory cells 211, 221 are connected to each other. The first memory cells 211, 221 store two first bit values w1 of the weights, respectively, and generate a first cell output signal PS1 which is transmitted to the capacitor sharing unit 300. The second memory cells 212, 222 are connected to each other. The second memory cells 212, 222 store two second bit values w2 of the weights, respectively, and generate a second cell output signal PS2 which is transmitted to the capacitor sharing unit 300. The third memory cells 213, 223 are connected to each other. The third memory cells 213, 223 store two third bit values w3 of the weights, respectively, and generate a third cell output signal PS3 which is transmitted to the capacitor sharing unit 300. The fourth memory cells 214, 224 are connected to each other. The fourth memory cells 214, 224 store two fourth bit values w4 of the weights, respectively, and generate a fourth cell output signal PS4 which is transmitted to the capacitor sharing unit 300. The fifth memory cells 21s, 22s are connected to each other. The fifth memory cells 212, 222 store two fifth bit values ws of the weights, respectively, and generate a fifth cell output signal PSS which is transmitted to the capacitor sharing unit 300. In the capacitor sharing unit 300, the capacitors are located among the switches and the sense amplifier 310. The switches are switched to generate two multiply results by the two input values respectively multiplied by the two weights, and then the total operational value is equal to a sum of the two multiply results. Accordingly, the multi-bit computing circuit 100a for the computing-in-memory applications of the present disclosure utilizes signed multi-bit weights stored in the memory cell array 200a in two's complement representation and the capacitor sharing unit 300 sharing for the total summation. Additionally, the input values of the input ports N1, N2 are given from gates of the fourth transistors mn1 of the memory cells, so that the multi-bit computing circuit 100a can solve the problem of the write disturb and be suitable for the computing-in-memory applications.

Figure 6:
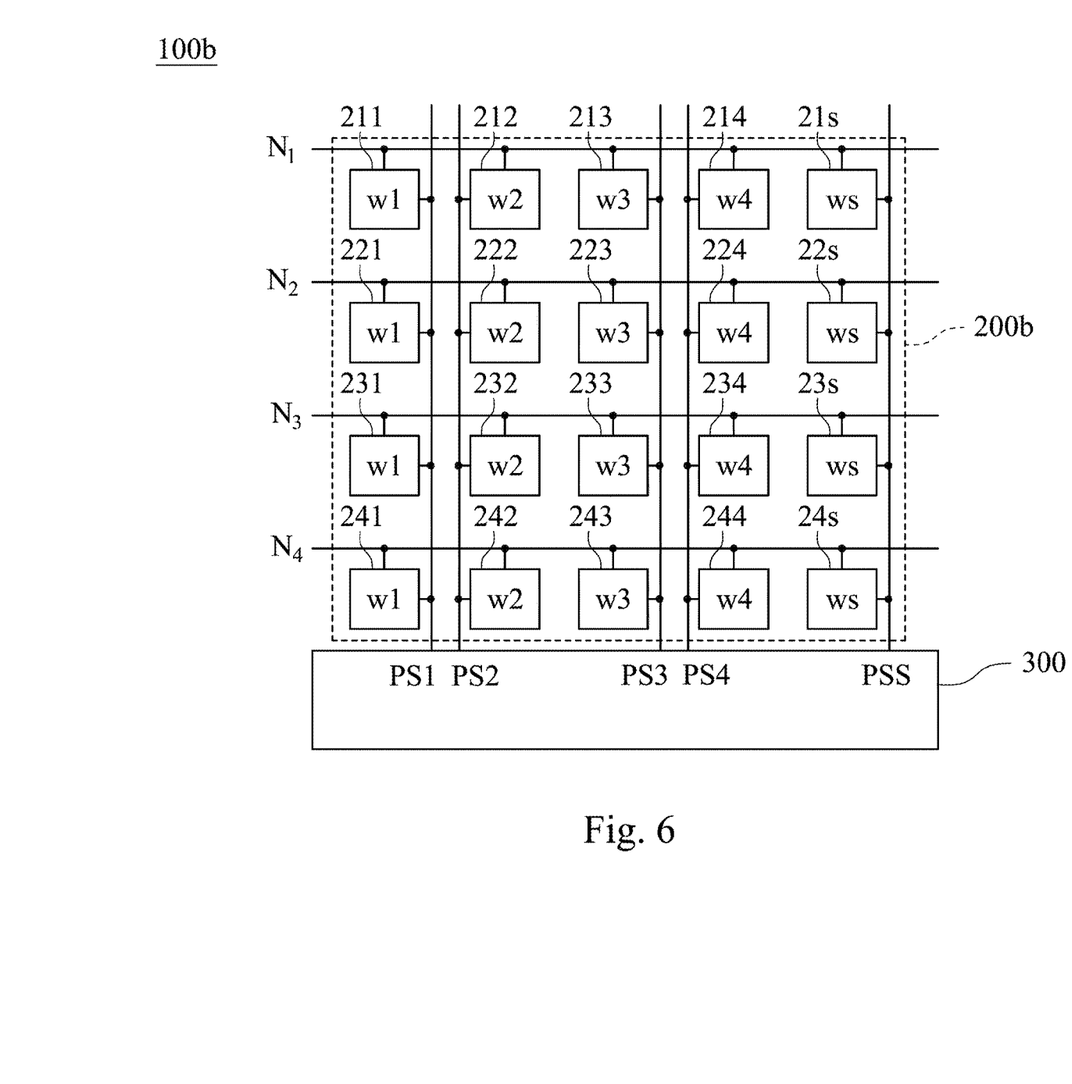
FIG. 6 shows a block diagram of a multi-bit computing circuit for computing-in-memory applications according to further another embodiment of the present disclosure.

FIG. 6 shows a block diagram of a multi-bit computing circuit 100b for computing-in-memory applications according to further another embodiment of the present disclosure. The multi-bit computing circuit 100b for the computing-in-memory applications is controlled by a first bit line BL, a second bit line BLB, a word line WL and a plurality of input ports N1, N2, N3, N4. The input ports N1, N2, N3, N4 transmit a plurality of input values, respectively, and the multi-bit computing circuit 100b for the computing-in-memory applications includes a memory cell array 200b and a capacitor sharing unit 300.

In FIG. 6, the detail of the capacitor sharing unit 300 is the same as the embodiments of FIG. 1, and will not be described again herein. In FIG. 6, the multi-bit computing circuit 100b for the computing-in-memory applications further includes the memory cell array 200b. The memory cell array 200b includes a plurality of memory cells arranged in a matrix and is connected to the first bit line BL, the second bit line BLB, the word line WL and the input ports N1, N2, N3, N4. The memory cells store a plurality of weights which are formed in two's complement, and each of the memory cells generates a cell output signal PS<1> according to one of the input values and one of the weights. The structure of each of the memory cells of FIG. 6 is the same as the structure of the first memory cell 201 of FIG. 2. The memory cells include a plurality of first memory cells 211, 221, 231, 241, a plurality of second memory cells 212, 222, 232, 242, a plurality of third memory cells 213, 223, 233, 243, a plurality of fourth memory cells 214, 224, 234, 244 and a plurality of fifth memory cells 21s, 22s, 23s, 24s. The first memory cells 211, 221, 231, 241 are connected to each other. The first memory cells 211, 221, 231, 241 store a plurality of first bit values w1 of the weights, respectively, and generate a first cell output signal PS1 which is transmitted to the capacitor sharing unit 300. The second memory cells 212, 222, 232, 242 are connected to each other. The second memory cells 212, 222, 232, 242 store a plurality of second bit values w2 of the weights, respectively, and generate a second cell output signal PS2 which is transmitted to the capacitor sharing unit 300. The third memory cells 213, 223, 233, 243 are connected to each other. The third memory cells 213, 223, 233, 243 store a plurality of third bit values w3 of the weights, respectively, and generate a third cell output signal PS3 which is transmitted to the capacitor sharing unit 300. The fourth memory cells 214, 224, 234, 244 are connected to each other. The fourth memory cells 214, 224, 234, 244 store a plurality of fourth bit values w4 of the weights, respectively, and generate a fourth cell output signal PS4 which is transmitted to the capacitor sharing unit 300. The fifth memory cells 21s, 22s, 23s, 24s are connected to each other. The fifth memory cells 21s, 22s, 23s, 24s store a plurality of fifth bit values ws of the weights, respectively, and generate a fifth cell output signal PSS which is transmitted to the capacitor sharing unit 300. In the capacitor sharing unit 300, the capacitors are located among the switches and the sense amplifier 310. The switches are switched to generate a plurality of multiply results by the input values respectively multiplied by the weights, and then the total operational value is equal to a sum of the multiply results. Table 1 lists the weights in the memory cells and the total operational value of the capacitor sharing unit 300. Therefore, the multi-bit computing circuit 100b for the computing-in-memory applications of the present disclosure utilizes signed multi-bit weights stored in the memory cell array 200b in two's complement representation and the capacitor sharing unit 300 sharing for the total summation. In addition, the input values of the input ports N1, N2, N3, N4 are given from gates of the fourth transistors mn1 of the memory cells, so that the multi-bit computing circuit 100b can solve the problem of the write disturb and be suitable for the computing-in-memory applications.

TABLE 1

| | | | weight | | | | | Multiply result |
|---|---|---|---|---|---|---|---|---|
| | | | | two's component | | | | (input × |
| index | input | value | ws | w4 | w3 | w2 | w1 | value) |
| 1 | 00 | 0 | 0 | 0 | 0 | 0 | 0 | 0 |
| 2 | 01 | 2 | 0 | 0 | 0 | 1 | 0 | 2 |
| 3 | 01 | 4 | 0 | 0 | 1 | 0 | 0 | 4 |
| 4 | 00 | 3 | 0 | 0 | 0 | 1 | 1 | 0 |
| 5 | 01 | −1 | 1 | 1 | 1 | 1 | 1 | −1 |
| 6 | 00 | −2 | 1 | 1 | 1 | 1 | 0 | 0 |
| 7 | 01 | −3 | 1 | 1 | 1 | 0 | 1 | −3 |
| 8 | 00 | −16 | 1 | 0 | 0 | 0 | 0 | 0 |
| | circuit implementation | | PSS = Σ (input × ws) = 2 | PS4 = Σ (input × w4) = 2 | PS3 = Σ (input × w3) = 3 | PS2 = Σ (input × w2) = 2 | PS1 = Σ (input × w1) = 2 | Σ (input × weight) |
| | total operational value | | PSS × (−16) + PS4 × (+8) + PS3 × (+4) + PS2 × (+2) + PS1 × (+1) 2 | | | | | 2 |

Figure 7:
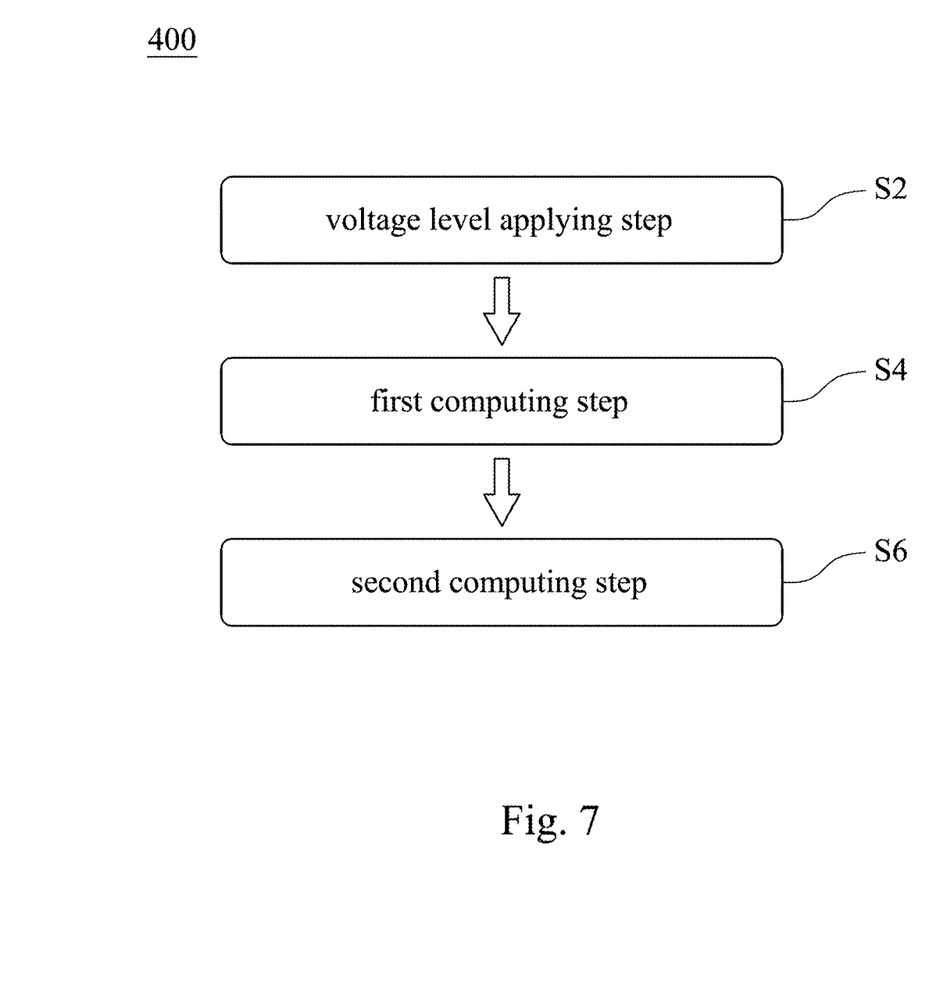
FIG. 7 shows a flow chart of a computing method of a multi-bit computing circuit for computing-in-memory applications according to one embodiment of the present disclosure.

FIG. 7 shows a flow chart of a computing method 400 of a multi-bit computing circuit for computing-in-memory applications according to one embodiment of the present disclosure. The computing method 400 may be applied to the multi-bit computing circuit 100 for the computing-in-memory applications of FIG. 1 and provides a voltage level applying step S2, a first computing step S4 and a second computing step S6.

The voltage level applying step S2 is for applying a plurality of voltage levels to the input value, the weight and the switches, respectively. The first computing step S4 is for driving the memory cells of the memory cell array 200 to generate the cell output signal PS according to the voltage levels of the input value and the weight. In the first computing step S4, a first memory cell 201, a second memory cell 202, a third memory cell 203, a fourth memory cell 204 and a fifth memory cell 20s are driven to generate a first cell output signal PS1, a second cell output signal PS2, a third cell output signal PS3, a fourth cell output signal PS4 and a fifth cell output signal PSS, respectively, and then the first cell output signal PS1, the second cell output signal PS2, the third cell output signal PS3, the fourth cell output signal PS4 and the fifth cell output signal PSS are transmitted to the capacitor sharing unit 300.

The second computing step S6 is for driving the capacitor sharing unit 300 and switching the switches to enable the total operational value to be equal to the input value multiplied by the weight. In the second computing step S6, a first capacitor C1 is disposed between the capacitor output node VOUTN and the first memory cell 201. A second capacitor C2 is disposed between the capacitor output node VOUTN and the second memory cell 202. A third capacitor C3 is disposed between the capacitor output node VOUTN and the third memory cell 203. A fourth capacitor C4 is disposed between the capacitor output node VOUTN and the fourth memory cell 204. A fifth capacitor CS is disposed between the capacitor output node VOUTN and the fifth memory cell 20s. A sixth capacitor C6 is disposed between the capacitor output node VOUTN and a ground voltage VSS. The first capacitor C1, the second capacitor C2, the third capacitor C3, the fourth capacitor C4, the fifth capacitor CS and the sixth capacitor C6 are sharing for the total summation. In the second computing step S6, a first switch K1 is disposed between the first capacitor C1 and the first memory cell 201. A second switch K2 is disposed between the second capacitor C2 and the second memory cell 202. A third switch K3 is disposed between the third capacitor C3 and the third memory cell 203. A fourth switch is disposed between the fourth capacitor C4 and the fourth memory cell 204, and a fifth switch KS is disposed between the fifth capacitor CS and the fifth memory cell 20s. The first switch K1, the second switch K2, the third switch K3, the fourth switch K4 and the fifth switch KS are synchronously switched. When the voltage levels of the first switch K1, the second switch K2, the third switch K3 and the fourth switch K4 are equal to one, the voltage level of the fifth switch KS is equal to zero. The first capacitor C1 is coupled to the first cell output signal PS1 via the first switch K1. The second capacitor C2 is coupled to the second cell output signal PS2 via the second switch K2. The third capacitor C3 is coupled to the third cell output signal PS3 via the third switch K3. The fourth capacitor C4 is coupled to the fourth cell output signal PS4 via the fourth switch K4, and the fifth capacitor CS is coupled to the power source voltage VDD via the fifth switch KS. On the contrary, when the voltage levels of the first switch K1, the second switch K2, the third switch K3 and the fourth switch K4 are equal to zero, the voltage level of the fifth switch is equal to one. The first capacitor C1 is coupled to the power source voltage VDD via the first switch K1. The second capacitor C2 is coupled to the power source voltage VDD via the second switch K2. The third capacitor C3 is coupled to the power source voltage VDD via the third switch K3. The fourth capacitor C4 is coupled to the power source voltage VDD via the fourth switch K4, and the fifth capacitor CS is coupled to the fifth cell output signal PSS via the fifth switch KS. In the second computing step S6, a first buffer BUF1 is disposed between the first switch K1 and the first memory cell 201. A second buffer BUF2 is disposed between the second switch K2 and the second memory cell 202. A third buffer BUF3 is disposed between the third switch K3 and the third memory cell 203. A fourth buffer BUF4 is disposed between the fourth switch K4 and the fourth memory cell 204, and a fifth buffer BUFS is disposed between the fifth switch KS and the fifth memory cell 20s. Hence, the computing method 400 of the present disclosure utilizes a signed multi-bit weight stored in the memory cell array 200 in two's complement representation and the capacitor sharing unit 300 sharing for the total summation.

Moreover, the input value of the input port N is given from a gate of the fourth transistor mn1, so that the computing method 400 combined with the multi-bit computing circuit 100 can solve the problem of the write disturb and be suitable for the computing-in-memory applications. Certainly, the computing method 400 may be utilized in the multi-bit computing circuit 100a, 100b for the computing-in-memory applications of FIGS. 5 and 6.

Figure 8:
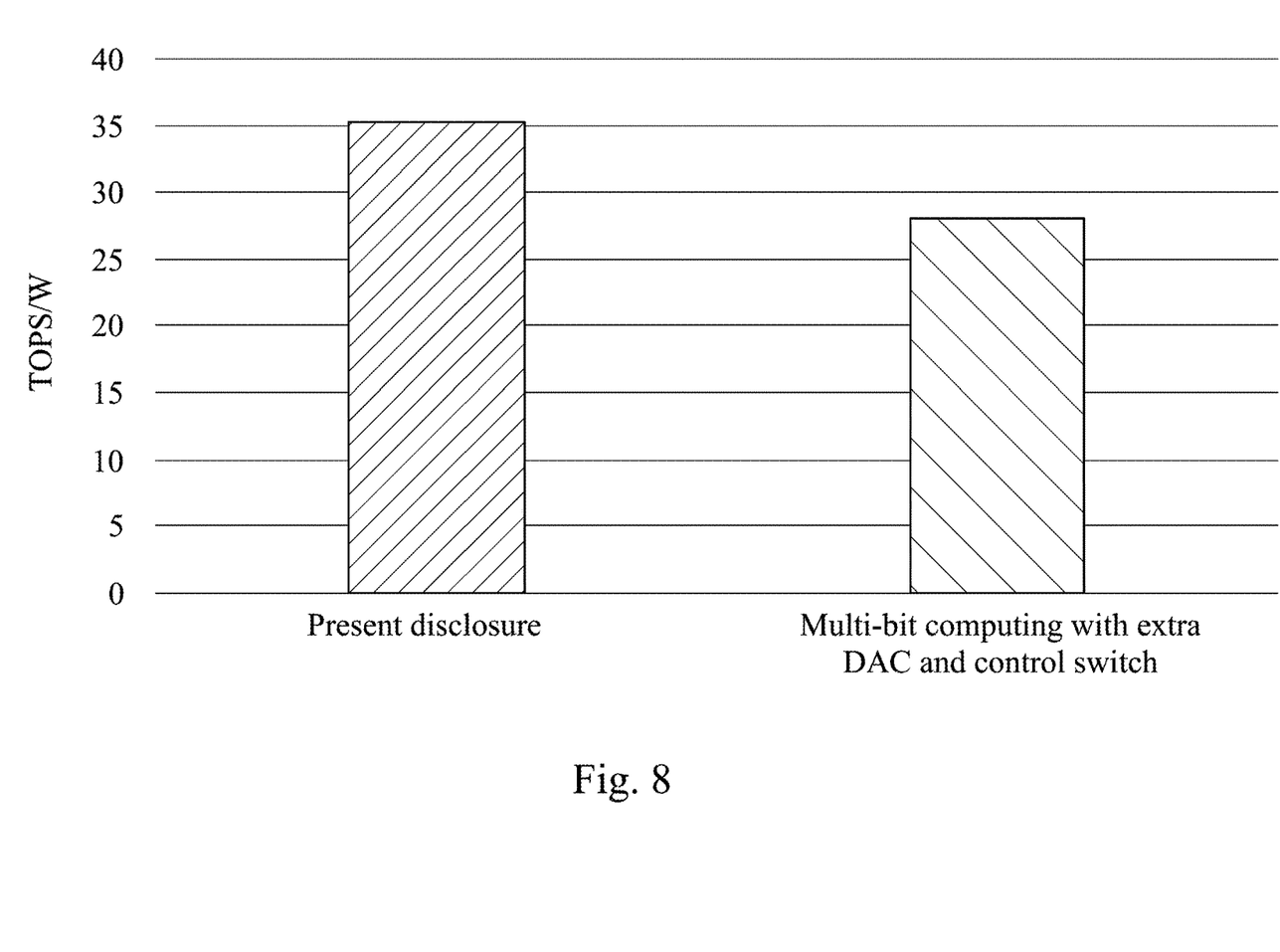
FIG. 8 shows a comparison result of the energy efficiency between the computing method of the present disclosure and a conventional method.

FIG. 8 shows a comparison result of the energy efficiency between the computing method 400 of the present disclosure and a conventional method. In FIGS. 7 and 8, the computing method 400 of the present disclosure can increase the energy efficiency by about 1.25 times, compared to a conventional method with an extra DAC structure.

According to the aforementioned embodiments and examples, the advantages of the present disclosure are described as follows.

1. The multi-bit computing circuit for the computing-in-memory applications and the computing method thereof of the present disclosure can utilize a signed multi-bit weight stored in the memory cell array in two's complement representation and the capacitor sharing unit sharing for the total summation without the extra DAC structure.

2. The multi-bit computing circuit for the computing-in-memory applications and the computing method thereof of the present disclosure can utilize the input value of the input port given from a gate of the fourth transistor and the 8T SRAM cells, so as to solve the problem of the write disturb and be suitable for the computing-in-memory applications.

3. The multi-bit computing circuit for the computing-in-memory applications and the computing method thereof of the present disclosure can increase the energy efficiency by about 1.25 times, compared to a conventional method with an extra DAC structure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A multi-bit computing circuit for computing-in-memory applications, which is controlled by a first bit line, a second bit line, a word line and an input port, the input port transmits an input value, and the multi-bit computing circuit for the computing-in-memory applications comprising:
   a memory cell array comprising a plurality of memory cells connected to the first bit line, the second bit line, the word line and the input port, wherein the memory cells store a weight which is formed in two's complement, and each of the memory cells generates a cell output signal according to the input value and the weight; and
   a capacitor sharing unit electrically connected to the memory cell array, and the capacitor sharing unit comprising:
      a plurality of switches electrically connected to the cell output signals, respectively;
      a plurality of capacitors electrically connected to the switches, respectively; and a sense amplifier electrically connected to the capacitors and generating a total operational value;

wherein the capacitors are located among the switches and the sense amplifier, and the switches are switched to enable the total operational value to be equal to the input value multiplied by the weight.

2. The multi-bit computing circuit for the computing-in-memory applications of claim 1, wherein each of the memory cells has a first node and a second node, the second node transmits the weight, and each of the memory cells comprises:

a first inverter located between the first node and the second node;

a second inverter connected to the first inverter;

a first transistor connected to the first node, the first bit line and the word line;

a second transistor connected to the second node, the second bit line and the word line;

a third transistor connected to the second node and a ground voltage; and a fourth transistor connected to the third transistor, the input port and the capacitor sharing unit, wherein the fourth transistor generates one of the cell output signals according to the input value of the input port.

3. The multi-bit computing circuit for the computing-in-memory applications of claim 1, wherein the memory cells comprise:

a first memory cell storing a first bit value of the weight and generating a first cell output signal which is transmitted to the capacitor sharing unit;

a second memory cell storing a second bit value of the weight and generating a second cell output signal which is transmitted to the capacitor sharing unit;

a third memory cell storing a third bit value of the weight and generating a third cell output signal which is transmitted to the capacitor sharing unit;

a fourth memory cell storing a fourth bit value of the weight and generating a fourth cell output signal which is transmitted to the capacitor sharing unit; and a fifth memory cell storing a fifth bit value of the weight and generating a fifth cell output signal which is transmitted to the capacitor sharing unit.

4. The multi-bit computing circuit for the computing-in-memory applications of claim 3, wherein the capacitor sharing unit further comprises a capacitor output node connected among the sense amplifier and the capacitors, and the capacitors comprise:

a first capacitor connected between the capacitor output node and the first memory cell, wherein the first capacitor has a first capacitance;

a second capacitor connected between the capacitor output node and the second memory cell, wherein the second capacitor has a second capacitance which is equal to twice the first capacitance;

a third capacitor connected between the capacitor output node and the third memory cell, wherein the third capacitor has a third capacitance which is equal to four times the first capacitance;

a fourth capacitor connected between the capacitor output node and the fourth memory cell, wherein the fourth capacitor has a fourth capacitance which is equal to eight times the first capacitance;

a fifth capacitor connected between the capacitor output node and the fifth memory cell, wherein the fifth capacitor has a fifth capacitance which is equal to sixteen times the first capacitance; and a sixth capacitor connected between the capacitor output node and a ground voltage, wherein the sixth capacitor has a sixth capacitance which is equal to the first capacitance.

5. The multi-bit computing circuit for the computing-in-memory applications of claim 4, wherein the switches comprise:

a first switch connected between the first capacitor and the first memory cell, wherein the first switch is switched to enable the first capacitor to be coupled to a power source voltage or the first cell output signal;

a second switch connected between the second capacitor and the second memory cell, wherein the second switch is switched to enable the second capacitor to be coupled to the power source voltage or the second cell output signal;

a third switch connected between the third capacitor and the third memory cell, wherein the third switch is switched to enable the third capacitor to be coupled to the power source voltage or the third cell output signal;

a fourth switch connected between the fourth capacitor and the fourth memory cell, wherein the fourth switch is switched to enable the fourth capacitor to be coupled to the power source voltage or the fourth cell output signal; and a fifth switch connected between the fifth capacitor and the fifth memory cell, wherein the fifth switch is switched to enable the fifth capacitor to be coupled to the power source voltage or the fifth cell output signal.

6. The multi-bit computing circuit for the computing-in-memory applications of claim 5, wherein the first switch, the second switch, the third switch, the fourth switch and the fifth switch are synchronously switched;

wherein when voltage levels of the first switch, the second switch, the third switch and the fourth switch are equal to one, a voltage level of the fifth switch is equal to zero, the first capacitor is coupled to the first cell output signal via the first switch, the second capacitor is coupled to the second cell output signal via the second switch, the third capacitor is coupled to the third cell output signal via the third switch, the fourth capacitor is coupled to the fourth cell output signal via the fourth switch, and the fifth capacitor is coupled to the power source voltage via the fifth switch;

wherein when the voltage levels of the first switch, the second switch, the third switch and the fourth switch are equal to zero, the voltage level of the fifth switch is equal to one, the first capacitor is coupled to the power source voltage via the first switch, the second capacitor is coupled to the power source voltage via the second switch, the third capacitor is coupled to the power source voltage via the third switch, the fourth capacitor is coupled to the power source voltage via the fourth switch, and the fifth capacitor is coupled to the fifth cell output signal via the fifth switch.

7. The multi-bit computing circuit for the computing-in-memory applications of claim 5, wherein the capacitor sharing unit further comprises:

a first buffer connected between the first switch and the first memory cell, wherein the first buffer is configured to store the power source voltage or the first cell output signal;

a second buffer connected between the second switch and the second memory cell, wherein the second buffer is configured to store the power source voltage or the second cell output signal;

a third buffer connected between the third switch and the third memory cell, wherein the third buffer is configured to store the power source voltage or the third cell output signal;

a fourth buffer connected between the fourth switch and the fourth memory cell, wherein the fourth buffer is configured to store the power source voltage or the fourth cell output signal; and a fifth buffer connected between the fifth switch and the fifth memory cell, wherein the fifth buffer is configured to store the power source voltage or the fifth cell output signal.

8. A computing method of the multi-bit computing circuit for the computing-in-memory applications of claim 1, comprising:

providing a voltage level applying step, wherein the voltage level applying step is for applying a plurality of voltage levels to the input value, the weight and the switches, respectively;

providing a first computing step, wherein the first computing step is for driving the memory cells of the memory cell array to generate the cell output signal according to the voltage levels of the input value and the weight; and providing a second computing step, wherein the second computing step is for driving the capacitor sharing unit and switching the switches to enable the total operational value to be equal to the input value multiplied by the weight.

9. The computing method of claim 8, wherein, in the first computing step, a first memory cell, a second memory cell, a third memory cell, a fourth memory cell and a fifth memory cell are driven to generate a first cell output signal, a second cell output signal, a third cell output signal, a fourth cell output signal and a fifth cell output signal, respectively, and then the first cell output signal, the second cell output signal, the third cell output signal, the fourth cell output signal and the fifth cell output signal are transmitted to the capacitor sharing unit.

10. The computing method of claim 9, wherein, in the second computing step, a first capacitor is disposed between the capacitor output node and the first memory cell, a second capacitor is disposed between the capacitor output node and the second memory cell, a third capacitor is disposed between the capacitor output node and the third memory cell, a fourth capacitor is disposed between the capacitor output node and the fourth memory cell, a fifth capacitor is disposed between the capacitor output node and the fifth memory cell, and a sixth capacitor is disposed between the capacitor output node and a ground voltage.

11. The computing method of claim 10, wherein, in the second computing step, a first switch is disposed between the first capacitor and the first memory cell, a second switch is disposed between the second capacitor and the second memory cell, a third switch is disposed between the third capacitor and the third memory cell, a fourth switch is disposed between the fourth capacitor and the fourth memory cell, and a fifth switch is disposed between the fifth capacitor and the fifth memory cell.

12. The computing method of claim 11, wherein, in the second computing step, the first switch, the second switch, the third switch, the fourth switch and the fifth switch are synchronously switched;

wherein when the voltage levels of the first switch, the second switch, the third switch and the fourth switch are equal to one, the voltage level of the fifth switch is equal to zero, the first capacitor is coupled to the first cell output signal via the first switch, the second capacitor is coupled to the second cell output signal via the second switch, the third capacitor is coupled to the third cell output signal via the third switch, the fourth capacitor is coupled to the fourth cell output signal via the fourth switch, and the fifth capacitor is coupled to the power source voltage via the fifth switch;

wherein when the voltage levels of the first switch, the second switch, the third switch and the fourth switch are equal to zero, the voltage level of the fifth switch is equal to one, the first capacitor is coupled to the power source voltage via the first switch, the second capacitor is coupled to the power source voltage via the second switch, the third capacitor is coupled to the power source voltage via the third switch, the fourth capacitor is coupled to the power source voltage via the fourth switch, and the fifth capacitor is coupled to the fifth cell output signal via the fifth switch.

13. The computing method of claim 11, wherein, in the second computing step, a first buffer is disposed between the first switch and the first memory cell, a second buffer is disposed between the second switch and the second memory cell, a third buffer is disposed between the third switch and the third memory cell, a fourth buffer is disposed between the fourth switch and the fourth memory cell, and a fifth buffer is disposed between the fifth switch and the fifth memory cell.

14. A multi-bit computing circuit for computing-in-memory applications, which is controlled by a first bit line, a second bit line, a word line and a plurality of input ports, each of the input ports transmits an input value, and the multi-bit computing circuit for the computing-in-memory applications comprising:

a memory cell array comprising a plurality of memory cells arranged in a matrix and connected to the first bit line, the second bit line, the word line and the input ports, wherein the memory cells store a plurality of weights which are formed in two's complement, and each of the memory cells generates a cell output signal according to one of the input values and one of the weights; and a capacitor sharing unit electrically connected to the memory cell array, and the capacitor sharing unit comprising:

a plurality of switches electrically connected to the cell output signals, respectively;

a plurality of capacitors electrically connected to the switches, respectively; and a sense amplifier electrically connected to the capacitors and generating a total operational value;

wherein the capacitors are located among the switches and the sense amplifier, the switches are switched to generate a plurality of multiply results by the input values respectively multiplied by the weights, and then the total operational value is equal to a sum of the multiply results.

15. The multi-bit computing circuit for the computing-in-memory applications of claim 14, wherein each of the memory cells has a first node and a second node, the second node transmits one of the weights, and each of the memory cells comprises:

a first inverter located between the first node and the second node;

a second inverter connected to the first inverter;
a first transistor connected to the first node, the first bit line and the word line;
a second transistor connected to the second node, the second bit line and the word line;
a third transistor connected to the second node and a ground voltage; and
a fourth transistor connected to the third transistor, one of the input ports and the capacitor sharing unit, wherein the fourth transistor generates one of the cell output signals according to one of the input values of the input ports.

16. The multi-bit computing circuit for the computing-in-memory applications of claim 14, wherein the memory cells comprise:
a plurality of first memory cells connected to each other, wherein the first memory cells store a plurality of first bit values of the weights, respectively, and generate a first cell output signal which is transmitted to the capacitor sharing unit;
a plurality of second memory cells connected to each other, wherein the second memory cells store a plurality of second bit values of the weights, respectively, and generate a second cell output signal which is transmitted to the capacitor sharing unit;
a plurality of third memory cells connected to each other, wherein the third memory cells store a plurality of third bit values of the weights, respectively, and generate a third cell output signal which is transmitted to the capacitor sharing unit;
a plurality of fourth memory cells connected to each other, wherein the fourth memory cells store a plurality of fourth bit values of the weights, respectively, and generate a fourth cell output signal which is transmitted to the capacitor sharing unit; and
a plurality of fifth memory cells connected to each other, wherein the fifth memory cells store a plurality of fifth bit values of the weights, respectively, and generate a fifth cell output signal which is transmitted to the capacitor sharing unit.

17. The multi-bit computing circuit for the computing-in-memory applications of claim 16, wherein the capacitor sharing unit further comprises a capacitor output node connected among the sense amplifier and the capacitors, and the capacitors comprise:
a first capacitor connected between the capacitor output node and the first memory cell, wherein the first capacitor has a first capacitance;
a second capacitor connected between the capacitor output node and the second memory cell, wherein the second capacitor has a second capacitance which is equal to twice the first capacitance;
a third capacitor connected between the capacitor output node and the third memory cell, wherein the third capacitor has a third capacitance which is equal to four times the first capacitance;
a fourth capacitor connected between the capacitor output node and the fourth memory cell, wherein the fourth capacitor has a fourth capacitance which is equal to eight times the first capacitance;
a fifth capacitor connected between the capacitor output node and the fifth memory cell, wherein the fifth capacitor has a fifth capacitance which is equal to sixteen times the first capacitance; and
a sixth capacitor connected between the capacitor output node and a ground voltage, wherein the sixth capacitor has a sixth capacitance which is equal to the first capacitance.

18. The multi-bit computing circuit for the computing-in-memory applications of claim 17, wherein the switches comprise:
a first switch connected between the first capacitor and the first memory cell, wherein the first switch is switched to enable the first capacitor to be coupled to a power source voltage or the first cell output signal;
a second switch connected between the second capacitor and the second memory cell, wherein the second switch is switched to enable the second capacitor to be coupled to the power source voltage or the second cell output signal;
a third switch connected between the third capacitor and the third memory cell, wherein the third switch is switched to enable the third capacitor to be coupled to the power source voltage or the third cell output signal;
a fourth switch connected between the fourth capacitor and the fourth memory cell, wherein the fourth switch is switched to enable the fourth capacitor to be coupled to the power source voltage or the fourth cell output signal; and
a fifth switch connected between the fifth capacitor and the fifth memory cell, wherein the fifth switch is switched to enable the fifth capacitor to be coupled to the power source voltage or the fifth cell output signal.

19. The multi-bit computing circuit for the computing-in-memory applications of claim 18, wherein the first switch, the second switch, the third switch, the fourth switch and the fifth switch are synchronously switched;
wherein when voltage levels of the first switch, the second switch, the third switch and the fourth switch are equal to one, a voltage level of the fifth switch is equal to zero, the first capacitor is coupled to the first cell output signal via the first switch, the second capacitor is coupled to the second cell output signal via the second switch, the third capacitor is coupled to the third cell output signal via the third switch, the fourth capacitor is coupled to the fourth cell output signal via the fourth switch, and the fifth capacitor is coupled to the power source voltage via the fifth switch;
wherein when the voltage levels of the first switch, the second switch, the third switch and the fourth switch are equal to zero, the voltage level of the fifth switch is equal to one, the first capacitor is coupled to the power source voltage via the first switch, the second capacitor is coupled to the power source voltage via the second switch, the third capacitor is coupled to the power source voltage via the third switch, the fourth capacitor is coupled to the power source voltage via the fourth switch, and the fifth capacitor is coupled to the fifth cell output signal via the fifth switch.

20. The multi-bit computing circuit for the computing-in-memory applications of claim 18, wherein the capacitor sharing unit further comprises:
a first buffer connected between the first switch and the first memory cell, wherein the first buffer is configured to store the power source voltage or the first cell output signal;
a second buffer connected between the second switch and the second memory cell, wherein the second buffer is configured to store the power source voltage or the second cell output signal;

a third buffer connected between the third switch and the third memory cell, wherein the third buffer is configured to store the power source voltage or the third cell output signal;

a fourth buffer connected between the fourth switch and the fourth memory cell, wherein the fourth buffer is configured to store the power source voltage or the fourth cell output signal; and a fifth buffer connected between the fifth switch and the fifth memory cell, wherein the fifth buffer is configured to store the power source voltage or the fifth cell output signal.

* * * * *